United States Patent [19]

Kotecha

[11] Patent Number: 4,488,265
[45] Date of Patent: Dec. 11, 1984

[54] INTEGRATED DYNAMIC RAM AND ROS

[75] Inventor: Harish N. Kotecha, Manassas, Va.

[73] Assignee: IBM Corporation, Armonk, N.Y.

[21] Appl. No.: 393,970

[22] Filed: Jun. 30, 1982

[51] Int. Cl.³ ............................................. G11C 11/40
[52] U.S. Cl. ..................................... 365/189; 365/177
[58] Field of Search ............... 365/189, 230, 174, 177, 365/104, 94

[56] References Cited

U.S. PATENT DOCUMENTS

| | | | |
|---|---|---|---|
| 3,662,351 | 5/1972 | Ho et al. ................................ | 365/95 |
| 3,753,242 | 8/1973 | Townsend ............................. | 365/94 |
| 3,959,783 | 5/1976 | Fressineau . | |
| 3,983,544 | 9/1976 | Dennison et al. . | |
| 4,004,286 | 1/1977 | Mrazek . | |
| 4,103,185 | 7/1978 | Denes ................................... | 365/156 |
| 4,165,538 | 8/1979 | Kitamura . | |
| 4,266,283 | 5/1981 | Perlegos et al. . | |

OTHER PUBLICATIONS

R. T. Dennison, IBM TDB, Jun. 1978, pp. 190-193.
L. M. Arzubi, IBM TDB, Aug. 1975, p. 649.
S. Platt, IBM TDB, May 1975, p. 3543.
D. W. Westcott, IBM TDB, Mar. 1975, pp. 2915-2916.
J. L. Chu, et al., IBM TDB, Feb. 1975, pp. 2586-2587.
R. T. Dennison, et al., IBM TDB, Nov. 1978, pp. 2352-2355.
V. M. Simi, IBM TDB, Mar. 1973, p. 3166.
R. P. James, IBM TDB, Oct. 1971, p. 1435.
L. M. Arzubi, IBM TDB, Feb. 1973, p. 2948.
D. P. Repchick, IBM TDB, Jun. 1971, p. 285.
A. M. Zehle, IBM TDB, Jun. 1971, p. 273.
P. J. Krick, et al., IBM TDB, Oct. 1972, p. 1609.
W. Fischer, IBM TDB, Sep. 1977, p. 1501.

Primary Examiner—James W. Moffitt
Attorney, Agent, or Firm—John E. Hoel

[57] ABSTRACT

A combined read-only storage (ROS) and read/write random access memory (RAM) integrated circuit memory cell is disclosed. In a first cell embodiment, a ROS FET device and a RAM FET device are connected in common to a bit sensing line connected to a sense amplifier which senses if the ROS FET device has discharged the bit sensing line indicating that a gate is present on the ROS FET device. A write driver circuit is also connected to the bit sensing line, for providing current through the RAM FET device to the charge storage element for writing a one or a zero therein. In a second cell embodiment, a combined two-bit read-only storage and one-bit read/write random access memory integrated circuit cell is disclosed. The bit sensing line is shared by two ROS FET devices and one RAM FET device. In a third cell embodiment of the invention, a single binary bit is stored for read-only storage and a single binary bit is stored for read/write random access memory storage. The charge storage element shares a common node with the ROS FET device and the RAM FET device and the sense amplifier is connected to the opposite side of the RAM FET device.

25 Claims, 13 Drawing Figures

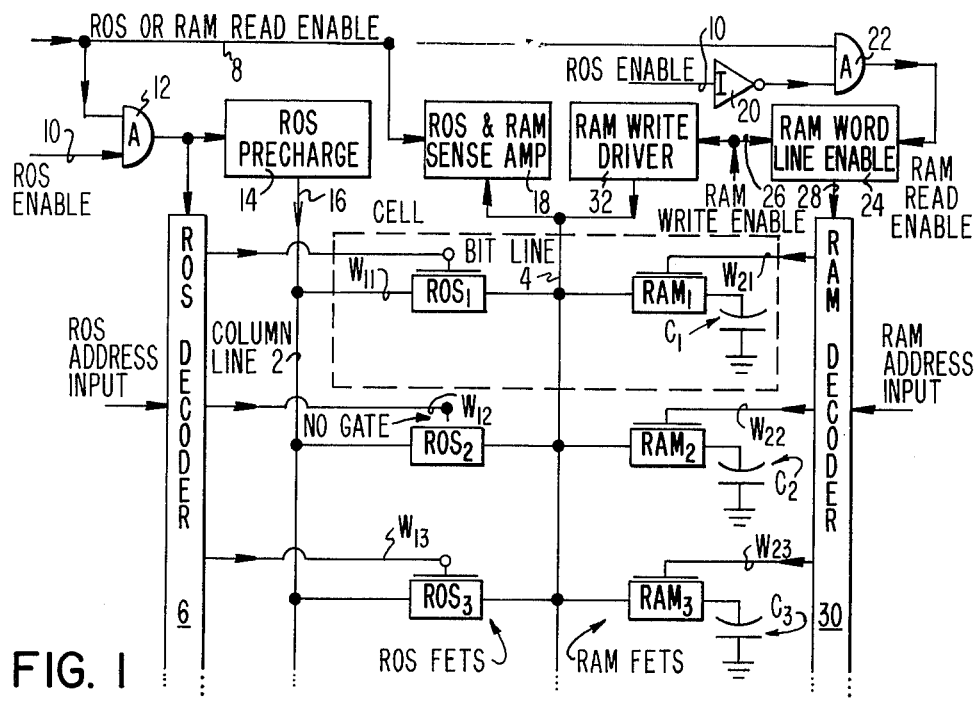
FIG. 1
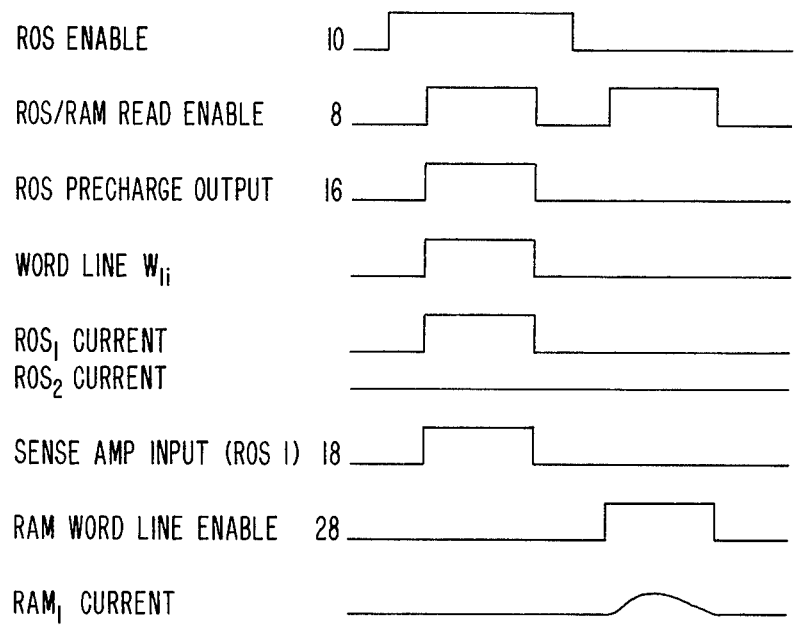
READING ROS OR RAM FIG. 2

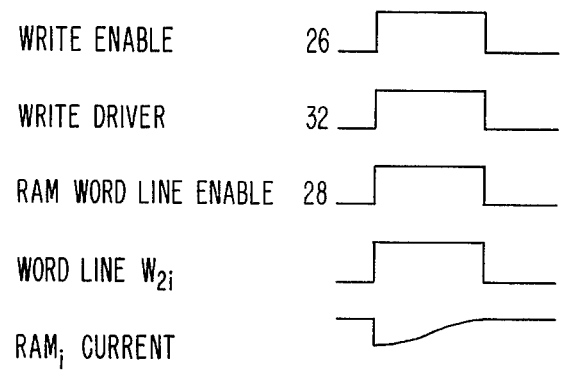
FIG. 3 WRITING RAM
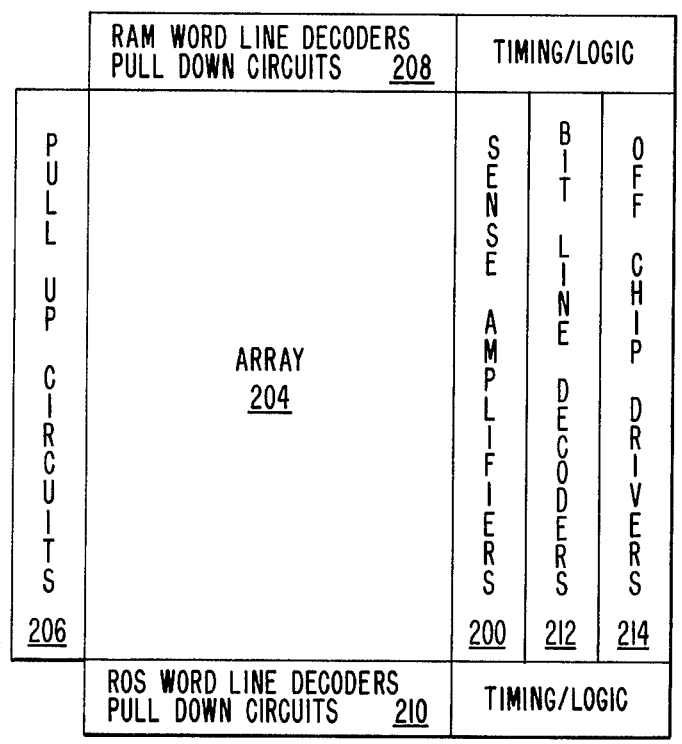
FIG. 10 CHIP ARCHITECTURE

ARRAY OF 3-BIT CELLS

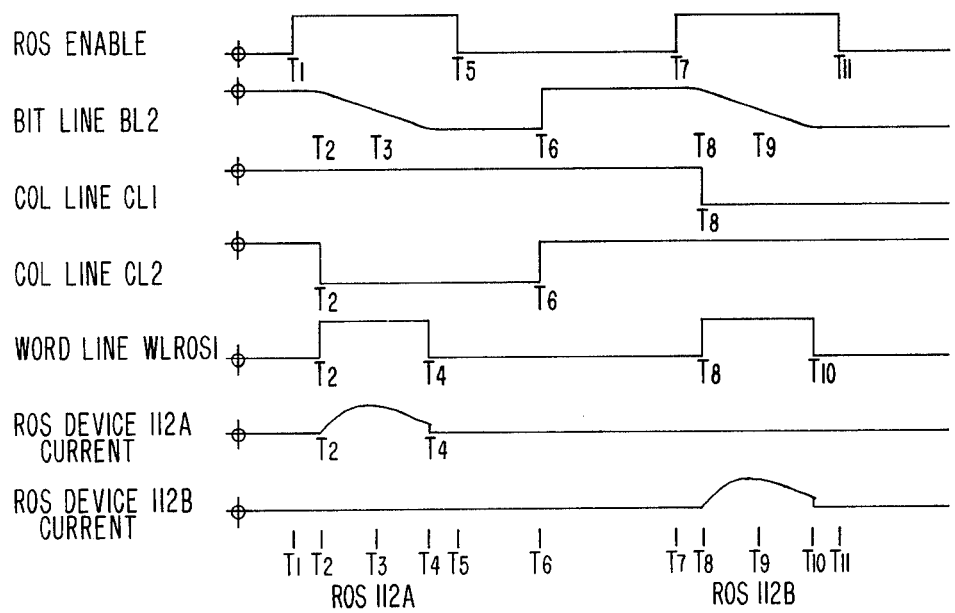
FIG. 8 READING ROS BITS IN 3-BIT CELL
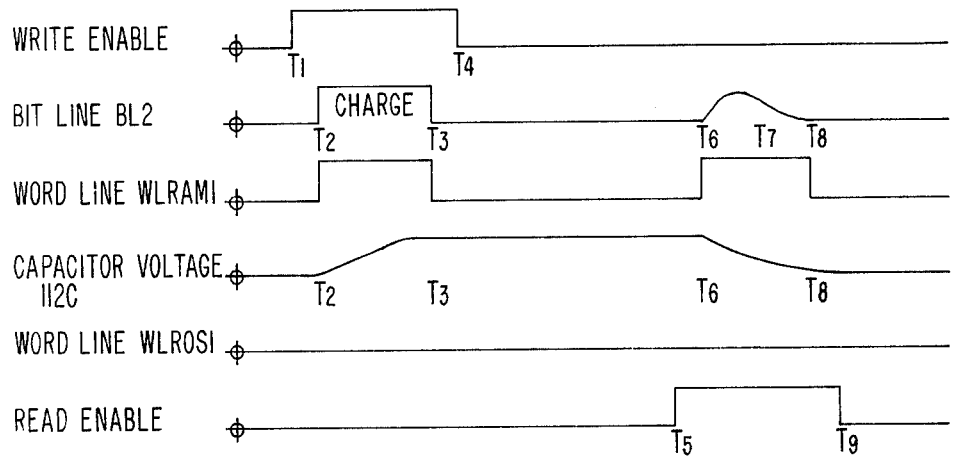
FIG. 9 WRITING AND READING THE RAM BIT IN THE 3-BIT CELL

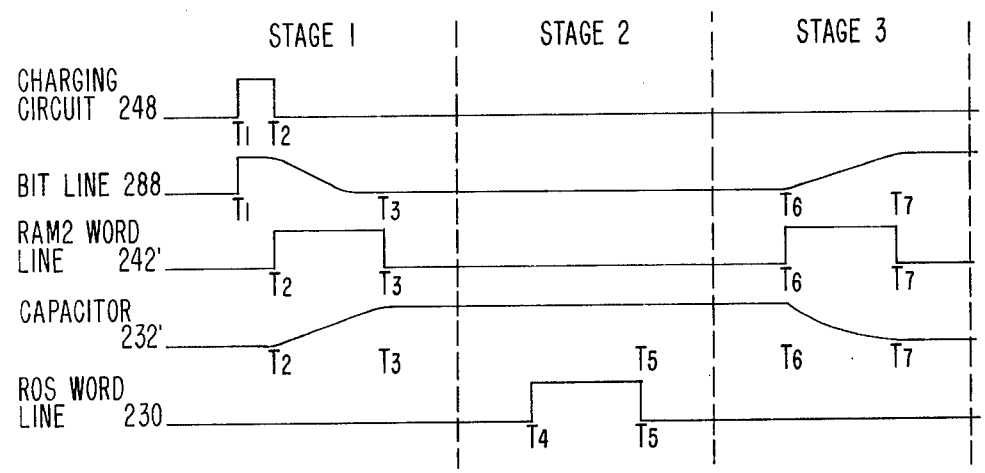
FIG. 13 READ OPERATION FOR ROS DEVICE 222' OF FIG. 11
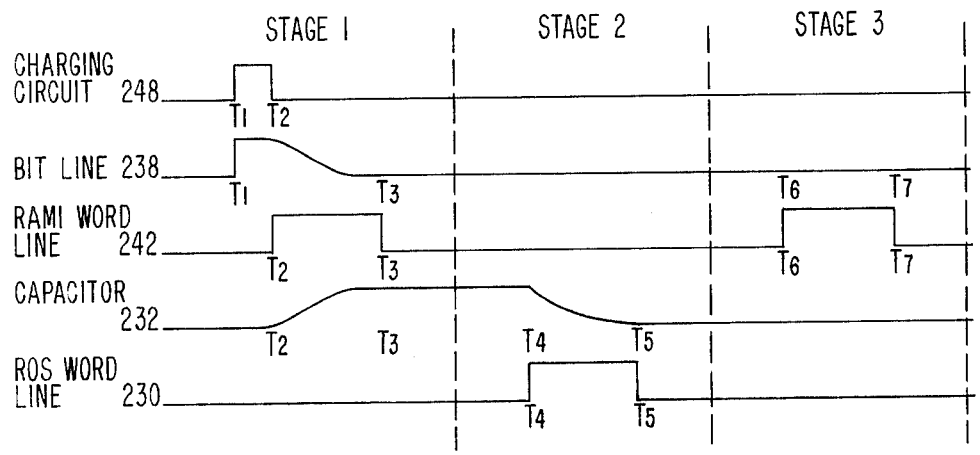
FIG. 12 READ OPERATION FOR ROS DEVICE 222 OF FIG. 11

INTEGRATED DYNAMIC RAM AND ROS

FIELD OF THE INVENTION

The invention disclosed broadly relates to information storage circuits and more particularly relates to a combined read-only storage and read/write random access memory.

BACKGROUND OF THE INVENTION

The control storage of a microprocessor typically has a read-only storage (ROS) portion for storing microinstructions of the most basic, repetitive type, and a read/write memory (RAM) portion for storing higher level microinstructions. With the advent of very large scale integrated circuitry, many storage and logic functions can be embodied on the same semiconductor chip. What is needed is a combined read-only storage and read/write random access memory storage cell which can be advantageously employed in a control storage for a microprocessor, all on the same very large scale integrated circuit chip.

Another problem which occurs with the production of ROS devices is that after a period of field testing, engineering changes are made to the ROS design and then existing ROS devices which have been stockpiled must be scrapped. What is needed is the ability to salvage ROS devices and make productive use of them after the existing ROS design has been rendered obsolete. This could be done by combining other functions such as a RAM function into a memory cell with the ROS device, the RAM function then being available to make productive use of the ROS semiconductor devices which would otherwise have been scrapped.

Still further, the testing of random access memories by propagating bit patterns through the RAM is generally done both at the time of manufacture and when a data processing machine containing the RAM device is eventually turned on. Generally the source of such test patterns is an external testing unit, either a device tester at the time of production or an operating system program when the RAM is to be tested in its actual application at start-up time. An improvement in the speed and reliability of such tests could be accomplished by incorporating the test pattern bits in an accompanying read-only storage memory integrally associated in the same cell with the RAM.

OBJECTS OF THE INVENTION

It is therefore an object of the invention to provide a combined read-only storage memory and random access memory storage cell on the same integrated circuit chip, in a improved manner.

It is still a further object of the invention to provide a combined read-only storage and read/write random access memory storage cell which can be advantageously employed in a control storage for a microprocessor, in an improved manner.

It is still another object of the invention to salvage ROS devices for productive use, which would otherwise be scrapped due to engineering changes, in a improved manner.

It is yet a further object of the invention to provide stored test patterns for a RAM which are integrally associated with the devices to be tested, in an improved manner.

SUMMARY OF THE INVENTION

These and other objects, features and advantages of the invention are accomplished by the integrated dynamic RAM and ROS disclosed herein. A combined read-only storage (ROS) and read/write random access memory (RAM) integrated circuit memory cell is disclosed. A first FET ROS device is connected between a column line and a bit sensing line and a second FET RAM device is connected between the bit sensing line and a charge storage capacitor. Separate word lines are connected to the respective gates of the ROS FET device and the RAM FET device. In a first embodiment, a ROS FET device and a RAM FET device are connected in common to a bit sensing line connected to a sense amplifier, which senses if the ROS FET device has discharged the bit sensing line indicating that a gate is present on the ROS FET device. A write driver circuit is also connected to the bit sensing line, for providing current through the RAM FET device to the charge storage capacitor for writing a one or a zero therein. The sense amplifier is shared by both the ROS and the RAM FET devices during their alternate modes of operation.

A combined two-bit read-only storage and one-bit read/write random access memory integrated circuit cell is disclosed as the second embodiment of the invention. A first FET device in the cell has its source/drain path connected between a first column line and a bit sensing line and has a first selectively programmable gate connected to a first word line for providing read-only storage for a first binary bit. A second FET device in the cell has its source/drain path connected between a second column line and the bit sensing line and has a second selectively programmable gate connected to the first word line for providing read-only storage for a second binary bit. A third FET device in the cell has its source/drain path connected between the bit sensing line and a charge storage element and has a gate connected to a second word line for providing read/write random access memory for a third binary bit. The bit sensing line is thereby shared for both two bits of read-only storage and one bit of read/write random access memory.

In a third embodiment of the invention, a single binary bit is stored for read-only storage and a single binary bit is stored for read/write random access memory storage. In the third embodiment, the charge storage element shares a common node with the ROS FET device and the RAM FET device and the sense amplifier is connected to the opposite side of the RAM FET device.

The RAM device is written into and read from by passing a charge between the bit sense line and the charge storage element while the ROS device is off. The ROS device is read by executing a three stage process. First a charge is passed from the bit sense line to the charge storage element through the RAM device. Next the word line connected to the gate of the ROS device is pulsed. If the gate is effective, the ROS device will discharge the storage element, otherwise it will not. Then in the last stage, the RAM device is turned on and the sense amplifier can sense whether the ROS device was effective to discharge the storage element.

DESCRIPTION OF THE FIGURES

These and other objects, features and advantages of the invention will be more fully appreciated with reference to the accompanying figures.

FIG. 1 illustrates a circuit schematic diagram of a first embodiment of the invention.

FIG. 2 illustrates a timing diagram for reading the ROS or RAM of the first embodiment of FIG. 1.

FIG. 3 illustrates a waveform for writing the RAM of the first embodiment in FIG. 1.

FIG. 8 is a timing diagram for the second embodiment of the invention, reading the ROS bits in a three bit cell.

FIG. 9 is a timing diagram for the second embodiment of the invention, writing and reading the RAM bit in the three bit cell.

FIG. 10 is a schematic layout of the chip architecture for the second embodiment of the invention.

FIG. 12 is a waveform diagram for the third embodiment of FIG. 11, showing the read operation for ROS device 222.

FIG. 13 is a waveform diagram for the third embodiment of FIG. 11, showing the read operation for ROS device 222'.

DISCUSSION OF THE PREFERRED EMBODIMENT

Figure 4:
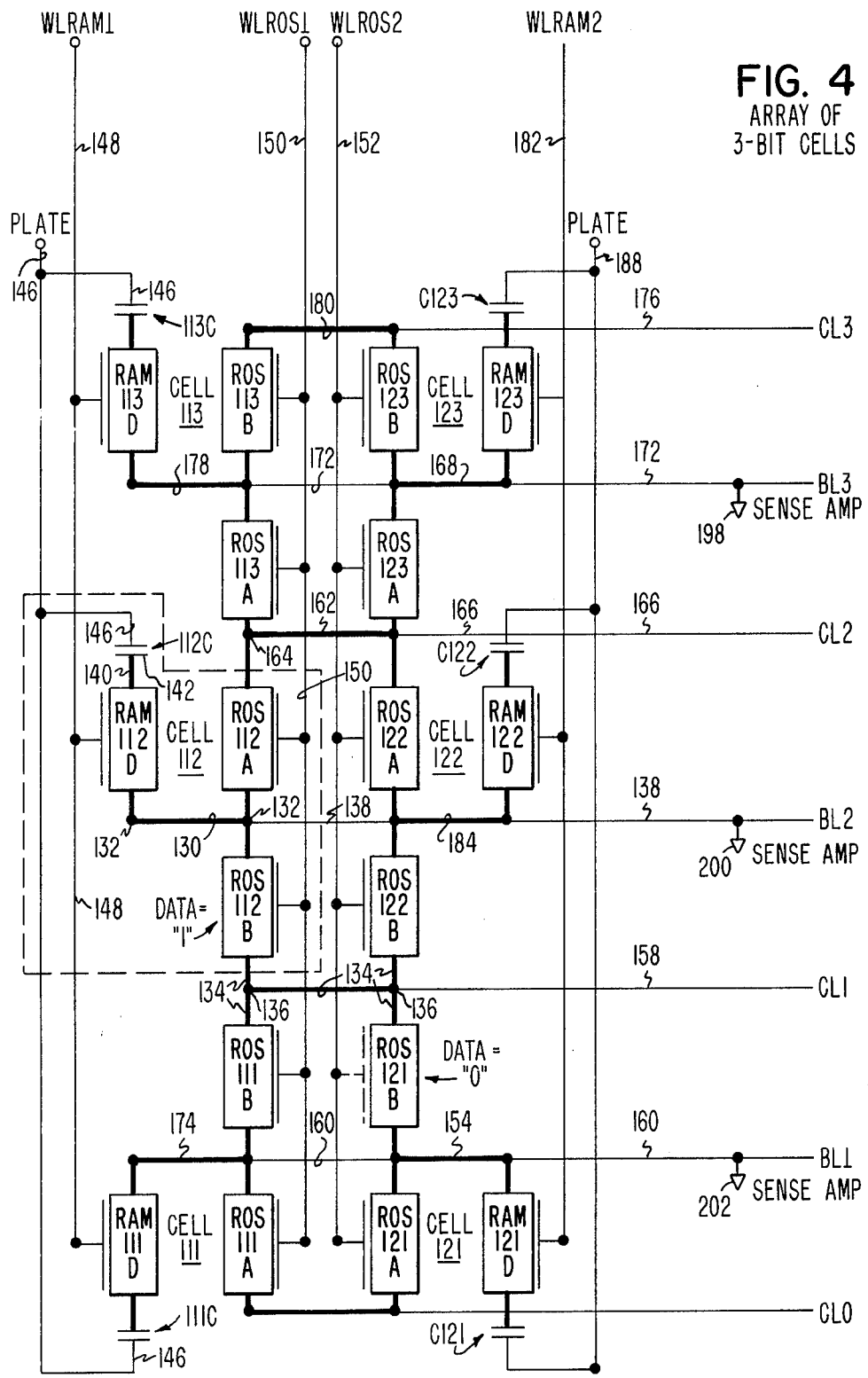
FIG. 4 shows a second embodiment of the invention with an array of three-bit cells.

A combined read-only storage (ROS) and read/write random access memory (RAM) integrated circuit memory cell is disclosed. A first FET ROS device is connected between a column line and a bit sensing line and a second FET RAM device is connected between the bit sensing line and a charge storage capacitor. Separate word lines are connected to the respective gates of the ROS FET device and the RAM FET device. In a first embodiment, a ROS FET device and a RAM FET device are connected in common to a bit sensing line connected to a sense amplifier, which senses if the ROS FET device has discharged the bit sensing line indicating that a gate is present on the ROS FET device. A write driver circuit is also connected to the bit sensing line, for providing current through the RAM FET device to the charge storage capacitor for writing a one or a zero therein. The sense amplifier is shared by both the ROS and the RAM FET devices during their alternate modes of operation.

FIGS. 1, 2 and 3 illustrate a first embodiment of the invention. In the circuit schematic diagram of FIG. 1, the combined read-only storage (ROS) and read/write random access memory (RAM) integrated circuit is shown. A first FET device $ROS_1$, has its source/drain path connected between a column line 2 and a bit sensing line 4. The device $ROS_1$ has a selectively programmable gate connected to a first, read-only storage word line $W_{11}$, for providing read-only storage for one binary bit by conducting current between the bit sensing line 4 and the column line 2, in response to a signal on the first word line $W_{11}$ when the selectively programmable gate for the device $ROS_1$ has a first binary state. The device $ROS_1$ will block current between the bit sensing line 4 and the column line 2 when the selectively programmable gate has a second binary state.

A second FET device $RAM_1$, has its source/drain path connected between the bit sensing line 4 and a charge storage element $C_1$. The device $RAM_1$ has a gate connected to a second RAM word line $W_{21}$, for providing a read/write random access memory for one binary bit by conducting current between the bit sensing line 4 and a charge storage element $C_1$ in response to a signal on the second word line $W_{21}$.

In this manner, the bit sensing line 4 is shared for both the read-only storage operation of the device $ROS_1$ and the read/write random access memory operation of the device $RAM_1$.

OPERATION OF THE FIRST EMBODIMENT

As is shown in FIG. 1, a ROS decoder 6 converts the read-only storage address input to an enabling signal on the word line $W_{11}$, when the ROS or RAM read enable line 8 and the ROS enable line 10 are both on, thereby satisfying the AND gate 12. The output from the AND gate 12 also triggers the ROS precharge circuit 14 which generates the output on the precharge line 16 as is shown in the waveform diagrams of FIG. 2.

There are a plurality of read-only storage FET devices generally referred to as $ROS_i$ for i equals 1 through N, in each column of such devices, as is shown in FIG. 1. A particular $ROS_i$ device will be programmed to permanently store a first binary bit by having its gate connected to its corresponding word line at the time of its fabrication, as is shown for example for $ROS_1$. If instead, a binary zero is to be permanently stored by the device $ROS_i$, then its gate will not be connected to its corresponding word line, as is shown for $ROS_2$ in FIG. 1. FIG. 2 illustrates the propagation of precharged current through $ROS_1$, when the word line $W_{11}$ is on, indicating that a binary one bit has been stored in $ROS_1$. FIG. 2 illustrates that no current flows through the device $ROS_2$ when its word line $W_{12}$ is on, indicating that a binary zero has been permanently stored in $ROS_2$. A sense amplifier, connected to the bit line 4, will sense a positive going signal when $ROS_1$ conducts current, as is shown in FIG. 2. The sense amplifier 18 connected to bit line 4 will not read any current for $ROS_2$, when its corresponding word line $W_{12}$ is turned on. The sense amplifier 18 is triggered to be ready for sensing, by having an input connected to the ROS or RAM read enable line 8, as is shown in FIG. 1.

When a ROS enable line 10 is not on, but a ROS or RAM read enable signal on line 8 is present, the ROS enable signal on line 10 is inverted by the inverter 20 and is input to the AND gate 22 whose other input is the ROS or RAM read enable line 8. This will enable the AND gate which outputs a RAM read enable signal to the RAM word line enable circuit 24. The RAM word line enable circuit has an additional input from the RAM write enable line 26. When either the RAM read enable line or the RAM write enable line is on, the RAM word line enable circuit 24 outputs on line 28 an enabling signal to the RAM decoder 30. This triggers the RAM decoder 30 to convert the RAM address input to an enabling signal on one of the word line $W_{2i}$. There are a plurality of RAM devices $RAM_i$, where i equals 1 to N, in the column of RAM devices shown in FIG. 1.

Each device $RAM_i$ has a corresponding word line $W_{2i}$ connected to its gate. When the word line $W_{2i}$ is on, it renders the device $RAM_i$ conductive so that charge can be transferred between the bit line 4 and the capacitive storage device $C_i$.

In order to read information from a particular RAM cell, the charge stored on the storage capacitor $C_i$ must be transferred to the bit line 4. This is done by providing the RAM read enable pulse from the AND gate 22 through the RAM word line enable circuit 24, over the line 28 to the RAM decoder 30, so as to enable the RAM address input to be converted to a word line signal on the corresponding word line $W_{2i}$ to the RAM device $RAM_i$. This will enable any charge stored on the capacitive storage device $C_i$ to discharge through the RAM device $RAM_i$ to the bit line 4, so as to be sensed by the ROS and RAM sense amplifier 18. This is illustrated by the waveform shown in FIG. 2 where the RAM word line enable waveform on line 28 is coincident with the current being discharged from the capacitor $C_i$ through the RAM device $RAM_i$ to the bit line 4.

In order to write new information into a RAM cell, the RAM write enable line 26 has an input pulse on it which is provided to both the RAM word line enable circuit 24 and the RAM write driver circuit 32. As is shown in the waveform diagrams of FIG. 3, the RAM word line enable circuit 24 will output an enabling pulse on line 28 to the RAM decoder 30, converting the RAM address input to an enabling signal on a respective one of the word lines $W_{2i}$. At the same time, the RAM write driver circuit 32 will output a charging pulse on the bit line 4. The RAM device $RAM_i$ which is turned on by the enabling signal on its word line $W_{2i}$, will conduct the charging pulse output from the RAM write driver circuit 32 over the bit line 4, to its corresponding capacitive storage device $C_i$, as is shown by the waveform diagrams of FIG. 3.

An alternate technique can be employed for accessing the memory cell shown in FIG. 1. A charging circuit can be connected to the bit sensing line for charging the bit sensing line. A sense amplifier circuit can be connected to the bit sensing line for sensing if the ROS FET device has discharged the bit sensing line indicating a first binary state. A write driver circuit can be connected to the bit sensing line, for providing current through the RAM FET device to the charge storage element, to write a one or a zero state therein. The sense amplifier can sense the one or zero state of the charge storage element in response to a signal on the second word line connected to the gate of the RAM FET device.

It can be appreciated that other techniques can be used to permanently program a binary one or a binary zero into the ROS devices. For example, instead of merely deleting the connection of the corresponding gate to the word line, the ROS device can be selectively programmed by selectively altering its gate threshold potential by means of ion implantation, or etching techniques on its gate electrode, for example. In addition, electrically programmable read-only memory devices (known as PROM, EEROM, or EAROM devices) can be substituted for the ROS devices described herein. Such devices are described, for example, in copending patent application Ser. No. 153,359, filed May 27, 1980 and now U.S. Pat. No. 4,334,292 by H. N. Kotecha, entitled "Dual Gate EAROM Cell Using Graded Energy Band Gap Insulator" and are further described in copending patent application Ser. No. 160,530, filed June 18, 1980 and now U.S. Pat. No. 4,336,603 by H. N. Kotecha, entitled "Dense PROM and EEROM Array Device," both applications being assigned to the instant assignee.

SECOND EMBODIMENT—COMBINED TWO BIT READ-ONLY STORAGE AND ONE BIT READ/WRITE RANDOM ACCESS MEMORY CELL

FIGS. 4 through 10 show a second embodiment of the invention which is a combined two bit read-only storage and one bit read/write random access memory integrated circuit cell.

FIG. 4 shows a circuit schematic diagram of an array of six of the three bit cells, a first three cells 111, 112, and 113 being located between the RAM word line 148 and the ROS word line 150, and a second group of three cells 121, 122 and 123 being located between the ROS word line 152 and the RAM word line 182.

Each three bit cell includes three FET transistor devices and a capacitive charge storage device. For example, cell 112 contains a first FET read-only storage device 112A, a second FET read-only storage device 112B, an FET random access memory device 112D, and a charge storage capacitor 112C. Each cell being generally referred to as having a number "1XX" shown in FIG. 4 has a first FET readonly storage (ROS) device "1XXA," a second FET readonly storage device "1XXB," an FET random access memory (RAM) device "1XXD," and a capacitive charge storage device "1XXC."

Referring specifically to cell 112 of FIG. 4 as being illustrative of each of the cells shown in FIG. 4, cell 112 is a combined two bit read-only storage and one bit read/write random access memory integrated circuit cell. It includes a first FET device 112A in the cell having its source/drain path connected between a first column line CL2 and the bit sensing line BL2 and it has a first selectively programmable gate connected to a first word line 150 which is labeled WL ROS1. The gate of each FET ROS device can be selectively programmed at the time of manufacture to permanently store either a binary one value or a binary zero value by making it have an effective gate electrode or not have an effective gate electrode. This can be done by selectively providing either a thick or thin gate insulating layer, or alternately by selectively ion implanting a particular threshold voltage level for the FET device. Alternately, the FET ROS devices described herein can be electrically alterable programmable read-only memory devices of conventional design.

The first FET device 112A will provide a read-only storage for a first binary bit in the cell 112, by selectively conducting current between the bit sensing line BL2 and the first column line CL2 in response to a signal on the first word line 150 when the programmable gate has been selectively included for the device. This will provide a first binary state for the FET ROS device 112A. Alternately, if the gate for the FET ROS device 112 was selectively made not effective at the time of manufacture, then the device 112A will block current between the bit sensing line BL2 and the column line CL2 without regard for the voltage on the first word line 150, thereby permanently storing a second binary state in the ROS FET device 112A.

The cell 112 further includes a second FET device 112B in the cell, having its source/drain path connected between a second column line CL1 and the bit sensing line BL2 and having a second selectively programmable gate connected to the first word line 150, for providing read-only storage for a second binary bit by conducting current between the bit sensing line BL2 and the second column line CL1 in response to a signal on the first word line 150 when the second selectively programmable gate of the FET device 112B has been made effective during the time of manufacture. This provides a permanent storage of a first binary state. Alternately, by making the second selectively programmable gate of the FET device 112B not effective at the time of manufacture, current will be blocked between the bit sensing line BL2 and the column line CL1 without regard for the potential on the first word line 150, thereby permanently storing a second binary state.

The cell 112 further includes a third FET device 112D in the cell, having its source/drain path connected between the bit sensing line BL2 and the charge storage element 112C. The third FET device 112D has a gate connected to a second word line 148 which is labeled WL RAM1 in FIG. 4. The third FET device 112D provides a read/write random access memory for a third binary bit in the cell by conducting current between the bit sensing line BL2 and the charge storage element 112C in response to a signal on the second word line 148.

In this manner, the bit sensing line BL2 is shared for both two bits of read-only storage and one bit of read/write random access memory.

Figure 5:
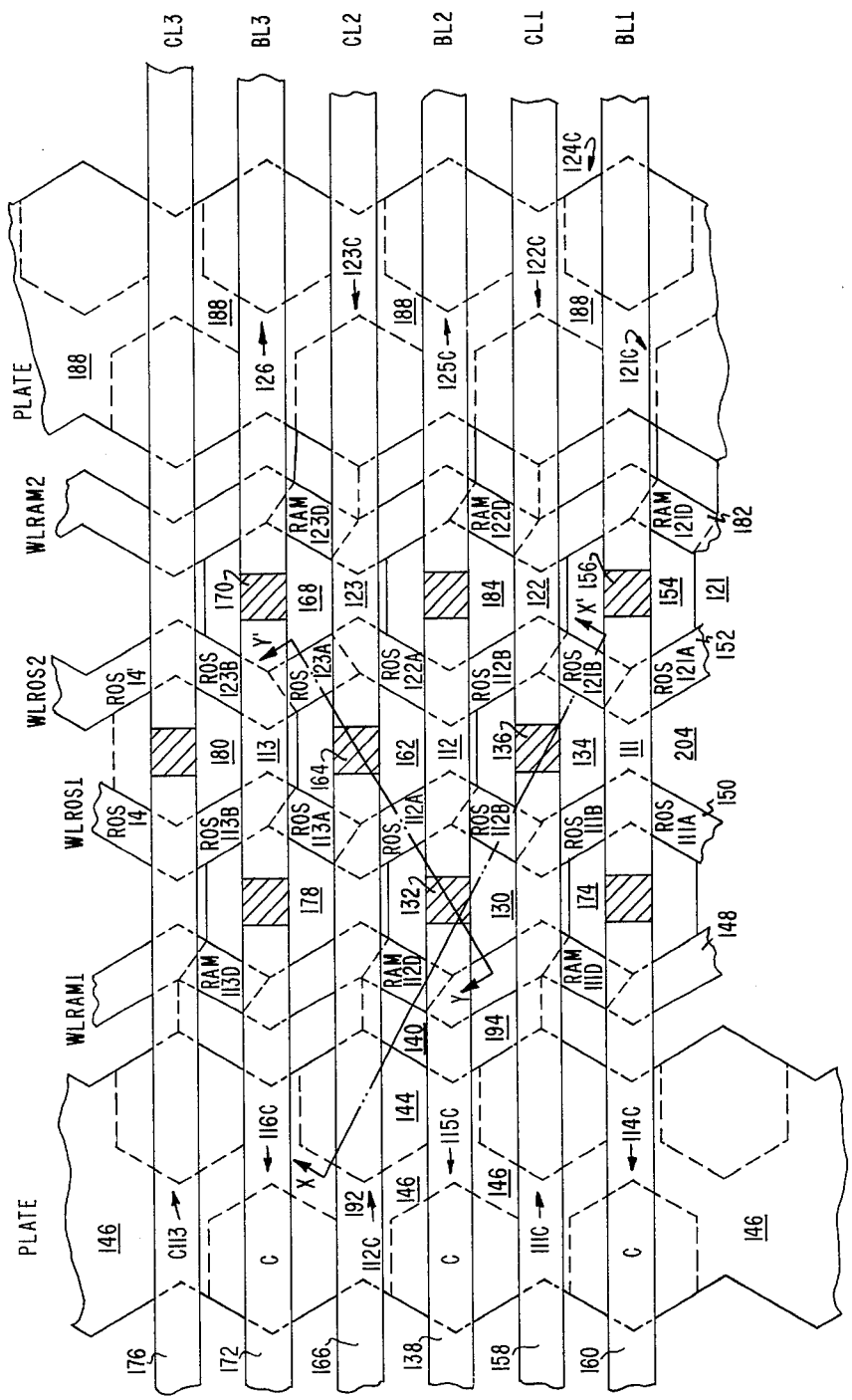
FIG. 5 is a layout diagram of the second embodiment of the invention.

Reference now to the layout diagram of FIG. 5, in conjunction with the electrical circuit schematic diagram of FIG. 4, will illustrate how the invention is embodied. It will still further facilitate an understanding of the invention to refer to the cross-sectional view in FIG. 6 which shows a cross-sectional view along the section lines X—X' of FIG. 5 and still further to refer to FIG. 7 which is a cross-sectional view along the section line Y—Y' of FIG. 5.

All of the FET devices and capacitors shown in the six cells of FIG. 4 are also shown embodied in the layout diagram of FIG. 5. The cross-sectional view in FIG. 6 along section line X—X' of FIG. 5 and a cross-sectional view in FIG. 7 along the section line Y—Y' of FIG. 5 illustrate the vertical structure for the cell 112, and the description herein of the structure of cell 112 will serve to illustrate the structure an entire array of such three bit cells.

Figure 6:
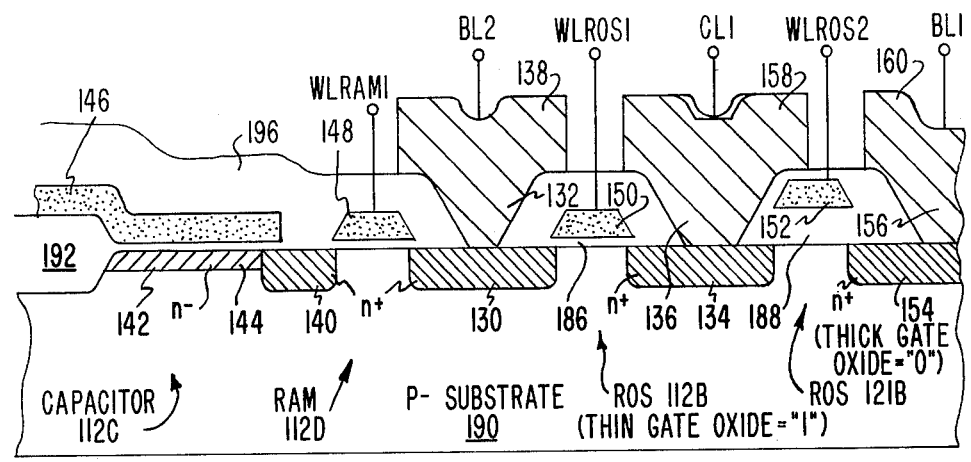
FIG. 6 is a cross-sectional view along the section line X—X' of FIG. 5.

The structure in which the invention is embodied starts with the lowest layer of P− type silicon substrate 190 into which have been formed recessed silicon dioxide regions 192 and 194 having thicknesses on the order of greater than 1 micron. Other regions on the surface of the semiconductor substrate 190 have thin layers of silicon dioxide formed thereon to serve as capacitor dielectrics or as gate insulator layers for FET devices. For example, FIG. 6 shows the thin silicon dioxide layer 144 which will serve as the capacitor dielectric layer for the charge storage capacitor 112C. FIG. 6 also shows the thin silicon dioxide layer 186 which will serve as the FET gate insulator layer for the ROS FET device 112B.

As was discussed above, some of the ROS FET devices will be selectively programmed at the time of manufacture so as to not have an effective gate electrode. For example, the FET ROS device 121B, shown in cross-section in FIG. 6, was intentionally formed with a gate insulator layer 188 which is substantially thicker than the normal FET gate insulator layer 186. Conventional FET gate insulator layers for effective FET ROS devices such as device 112B, have a thickness of approximately 500Å. The gate insulator layer 188 for the noneffective FET ROS device 121B, would have a thickness on the order of 5000Å, for example, thereby rendering the FET action for the resultant device incapacitated.

Figure 7:
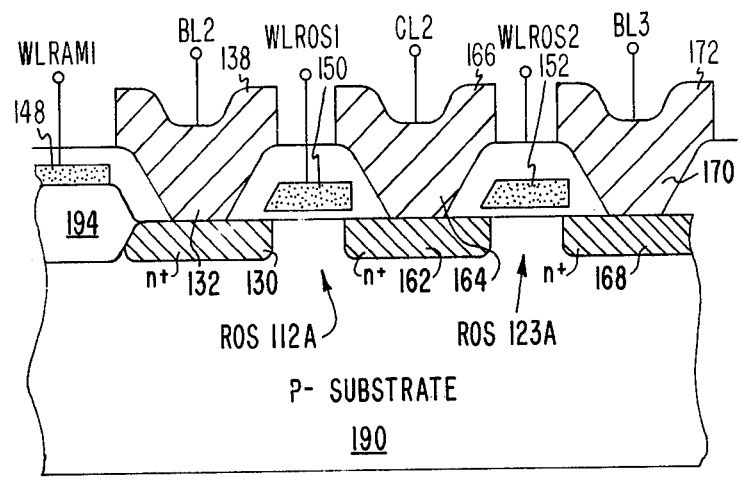
FIG. 7 is a cross-sectional view along the section line Y—Y' of FIG. 5.

The structure shown in FIGS. 5, 6 and 7 further includes N+ doped regions in the surface of the semiconductor substrate 190, which serve as the source and/or drain of FET devices, or as interconnection lines, or as capacitor plates. These N type doped regions can be formed by thermal diffusion processes or alternately by ion implantation processes or a combination of the two processes. For example, N+ doped region 140 will serve as the source electrode for the RAM FET device 112D and will also serve to interconnect the RAM FET device 112D to the lower capacitor electrode 142 of the capacitor 112C. The N+ doped region 140 is formed by either thermally diffusing or ion implanting phosphorus, arsenic, or other N type doping species through the window between the polycrystalline silicon gate electrode 148 and the upper polycrystalline silicon plate 146 of the capacitor 112C.

The N− doped region 142 which serves as the lower plate of the capacitor 112C, can be formed by the ion implantation of phosphorous ions, for example, through the overlying layer 146 of polycrystalline silicon and the thin silicon dioxide layer 144.

Similarly, the other N type doped regions shown in FIGS. 6 and 7 can be formed in the surface of the silicon P− substrate 190. The N+ region 130 is a hexagonally shaped region, as can be seen in FIG. 5, and serves as the drain for the RAM FET device 112D, serves as the drain of the ROS FET device 112A, and serves as the drain of the ROS FET device 112B, in addition to its serving as the interconnecting link between those three devices in cell 112. The hexagonal N+ doped region 130 is connected by means of the via contact 132 to the metal line 138 which serves as the bit line BL2 for the array shown in FIG. 4.

Proceeding along the section line X—X' in FIG. 5, and referring to its cross-sectional view in FIG. 6, the N+ doped region 134 is another hexagonally shaped region which serves as the source for the FET ROS device 112B, the FET ROS device 111B, the FET ROS device 121B, and the FET ROS device 122B, in addition to its serving as the interconnection link between these four devices. The N type doped region 134 is connected by means of the via hole contact 136 to the metal line 158 which serves as the column line CL1 in the circuit schematic diagram of FIG. 4. FIG. 6 further shows a next hexagonally shaped N+ region 154 which serves as the drain for the FET ROS device 121B and which is connected by means of the via hole contact 156 to the metal line 160 which serves as the bit line BL1 in the circuit schematic diagram of FIG. 4.

In the cross-sectional view shown in FIG. 7 along the section line Y—Y' of FIG. 5, the ROS FET device 112A can be shown formed between the hexagonally shaped N+ doped region 130 and the hexagonally shaped N+ doped region 162. The hexagonally shaped N+ region 162 serves as the source for the FET ROS device 112A, the FET ROS device 113A, the FET ROS device 122A, and the FET ROS device 123A. In addition, the hexagonally shaped N type region 162 serves as the interconnection link between these four FET ROS devices. The N type doped region 162 is connected by means of the via hole connection 164 to the metal line 166 which serves as the column line CL2 of the circuit of FIG. 4.

The FET ROS device 123A is formed between the hexagonally shaped N type region 162 and the hexagonally shaped N+ type region 168. The hexagonally shaped N+ type doped region 168 serves as the drain for the FET ROS device 123A, the FET ROS device 123B, and the FET RAM device 123D for the cell 123. The N type hexagonally shaped region 168 is connected by means of the via contact 170 to the metal line 172 which is the bit line BL3 of the circuit schematic diagram of FIG. 4.

A passivation layer 196 of silicon dioxide, for example, will then cover all exposed portions of the polycrystalline silicon layer, specifically the upper capacitor plate 146 for the capacitor 112C, the gate electrode 148 for the FET RAM device 112D, the gate electrode 150 for the FET ROS device 112B, the gate electrode 152 for the FET ROS device 121B, the polycrystalline silicon electrode 148 which serves as the WL RAM1 line in FIG. 7, and the polycrystalline silicon gate 152 for the ROS FET device 123A in FIG. 7.

A semiconductor process suitable for making the structure shown in FIGS. 5, 6 and 7 is described for example in U.S. Pat. No. 4,329,773 by Geipel, et al. entitled "Method of Making Low Leakage Shallow Junction IGFET Devices," which is assigned to the instant assignee.

As can be seen from an examination of the layout shown in FIG. 5, in conjunction with the circuit schematic diagram of FIG. 4 and the cross-sectional views of FIGS. 6 and 7, the three bit cells interconnected in the memory array are capable of being closely packed in a periodic arrangement which provides a high packing density. Cells 111, 112 and 113 are shown vertically packed one above the other in the plan view of FIG. 5, with the RAM FET device located to the left of its corresponding ROS FET devices in a left-handed symmetry. The cells 121, 122 and 123 are also shown vertically arranged in the plan view of FIG. 5 with their respective RAM FET devices located to the right of their corresponding FET ROS devices, in a right-handed symmetry. The ROS word lines 150 and 152 and the RAM word lines 148 and 182 are shown with a generally vertical orientation in the plan view of FIG. 5, with sequential segments following the contour of the edges of the hexagonally shaped N type doped regions. The ion implanted lower capacitor electrodes such as the electrode 142 of the capacitor 112C and the thin silicon dioxide capacitor dielectric regions such as the layer 144 of the capacitor 112C are also hexagonally shaped and their size fits within the periodic arrangement of hexagonally shaped N type diffused regions 130, etc. The upper polycrystalline silicon electrode 146 for the capacitors 111C, 112C and 113C is a common electrode as is shown in the plan view of FIG. 5, which is shared with the capacitors 114C, 115C and 116C for three bit cells positioned to the left of the layout shown in FIG. 5. Similarly, the polycrystalline silicon upper capacitor plate 188 is shared in common with the capacitors 121C, 122C and 123C and is also shared in common with the capacitors 124C, 125C and 126C for three bit cells located to the right of the layout shown in FIG. 5. It is noted that the area occupied by each capacitor, such as 112C, and thus its capacitance, can be adjusted for a particular application by altering the shape of the thin oxide dielectric layer 144 and changing the width of the upper polysilicon plate 146.

The hexagonally shaped N type diffusion 180 is connected by means of a via connector to the horizontal metal line 176 which serves as the column line CL3. The hexagonally shaped N type region 178 is connected by means of a via contact to the metal line 172 which serves as the bit line BL3. The hexagonally shaped N type region 168 is connected by means of the via contact 170 to the metal line 172 which serves as the bit line BL3. It is seen that the bit line BL3 serves as a common bit line for the cell 123 and the cell 113, which can also be seen in the schematic diagram of FIG. 4. The hexagonal N type region 162 is connected by means of the via contact 164 to the horizontal metal line 166 which serves as the column line CL2. The hexagonal N type region 130 is connected by means of the via contact 132 to the horizontal metal line 138 which serves as the bit line BL2. The hexagonal N type region 184 is connected by means of a via contact to the horizontal metal line 138 which serves as the bit line BL2. Thus it is seen that cell 122 and cell 112 are served by the same bit line BL2. The hexagonal N type region 134 is connected by means of the via contact 136 to the horizontal metal line 158 which serves as the column CL1. The hexagonal N type region 174 is connected by means of a via contact to the horizontal metal line 160 which serves as the bit line BL1. The hexagonally shaped N type region 154 is connected by means of the via contact 156 to the horizontal metal line 160 which serves as the bit line BL1. Thus it is seen that the cells 121 and 111 share the same bit line BL1.

Thus it is seen from an inspection of the layout shown in FIG. 5, the cross-sectional views shown in FIGS. 6 and 7 and the circuit schematic diagram shown in FIG. 4, that a highly compact periodic arrangement of the three bit cell is formed which combines the function of both a two bit read-only storage and a one bit read/write random access memory in a single integrated circuit memory cell.

It can be appreciated that other techniques can be used to permanently program a binary one or a binary zero into the ROS devices. For example, instead of merely deleting the connection of the corresponding gate to the word line, the ROS device can be selectively programmed by selectively altering its gate threshold potential by means of ion implantation, or etching techniques on its gate electrode, for example. In addition, electrically programmable read-only memory devices (known as PROM, EEROM, or EAROM devices) can be substituted for the ROS devices described herein. Such devices are described, for example, in copending patent application Ser. No. 153,359, filed May 27, 1980 by H. N. Kotecha, entitled "Dual Gate EAROM Cell Using Graded Energy Band Gap Insulator" and are further described in copending patent application Ser. No. 160,530, filed June 18, 1980 by H. N. Kotecha, entitled "Dense PROM and EEROM Array Device," both applications being assigned to the instant assignee.

OPERATION OF THE SECOND EMBODIMENT

FIG. 8 is a timing diagram which illustrates the operation of reading the ROS bits in a three bit cell of the second embodiment. FIG. 9 is a timing diagram which illustrates both writing and reading the RAM bit in the three bit cell of the second embodiment.

Referring now to FIG. 4 and FIG. 8, the two ROS FET devices 112A and 112B in the cell 112 can be alternately read by selectively conditioning either the column line CL2 or alternately the column line CL1, respectively.

The interval during which a read operation is to take place for the ROS FET device 112A is from the time T1 to the time T5, which is designated the ROS enable interval, in FIG. 8. Prior to the ROS enable interval, the bit line BL2, the column line CL1, and the column line CL2 are all maintained at a +5 volt potential whereas the word line WL ROS1 is maintained at ground potential. At the later time T2, since it is desired to read the ROS FET 112A, the column line CL2 has its potential reduced to ground potential and at the same time, the word line WL ROS1 has its potential raised to +5 volts. This applies a potential difference of 5 volts between the gate and the source of the ROS FET device 112A. The ROS FET device 112A then becomes conductive and current flows from the positive bit line BL2 through the ROS FET device 112A to the column line CL2, as is indicated by the waveform showing the ROS device 112A current in FIG. 8. Sense amplifiers 198, 200 and 202 are connected respectively to the bit lines BL3, BL2 and BL1, as is shown in FIG. 4. A description of these sense amplifiers can be found, for example, in the copending U.S. patent application Ser. No. 346,431 filed Feb. 5, 1982 and now U.S. Pat. No. 4,329,773 entitled "High Threshold Single Ended Sense Amplifier," by C. Lam, and assigned to the instant assignee. The sense amplifier 200 connected to the bit line BL2 will sense the reduction in the potential on the bit line BL2 between the time T2 and the time T3. In this manner, the binary bit of information which is permanently stored on the ROS FET device 112A can be read out.

Although the gate electrode for the ROS FET device 112B is connected in common with the gate electrode for the ROS FET device 112A in cell 112, the ROS FET device 112B does not conduct a significant quantity of current in the beginning of the interval between the time T2 and the time T3 when compared with the quantity of current conducted through the ROS FET device 112A. This is because the gate-to-source potential for the ROS FET device 112B is quite small since the gate potential is at 5 volts and the source potential for FET 112B is the potential of the bit line BL2 which is approximately 5 volts during the beginning of the interval. Since all of the FET devices in the array of FIG. 4 are enhancement mode N channel MOS FET devices, a positive source-to-gate potential difference of at least 1 volt must be applied to a device before it goes into conduction. Thus, the potential of the bit line BL2 must drop below 4 volts while the gate potential of the FET device 112B remains at 5 volts, in order for the device 112B to conduct. Since the sense amplifier 200 is capable of sensing voltage changes on the bit line BL2 having a magnitude less than approximately 200 millivolts, the condition that the ROS FET device 112A has gone into conduction is sensed by the sense amplifier 200 long before the second device 112B goes into conduction.

The second ROS FET device 112B can be selectively read out during a separate read cycle by reducing the potential on the column line CL1, as follows. During the ROS enable interval from T7 through T11, shown in FIG. 8, the potential of column line CL1 is reduced from its original +5 volt potential to ground potential at the time T8 while the potential of the word line WL ROS1 is raised from ground potential to +5 volts at the time T8. Since the potential of the bit line BL2 was restored to a +5 volts at the previous time T6 shown in FIG. 8, there is a positive potential difference between the gate and the source of the ROS FET device 112B which starts at the time T8. Current is conducted from the bit line BL2 through the ROS FET device 112B to the column line CL1 as is shown by the waveform for the ROS device 112B current. During the interval from the time T8 to the time T9, the bit line BL2 has its potential dropping and this reduction in its potential is sensed by the sense amplifier 200, thereby indicating the conductive state of the ROS FET device 112B, in a manner similar to the detection of current conduction as was previously described for the ROS FET device 112A.

Thus it is seen that either the first ROS FET device 112A or the second ROS FET device 112B in the cell 112 can be selectively interrogated for its permanently stored binary bit of information by selectively reducing the potential of either the column CL2 or the column line CL1, respectively. Since separate sense amplifiers 198, 200 and 202 are respectively connected to the bit lines BL3, BL2 and BL1 in the array of cells shown in FIG. 4, all of the even numbered column lines CL0, CL2, etc. could be connected in common and have their respective voltages changed in unison in order to read out their corresponding ROS FET devices 111A, 112A and 113A when the word line WL ROS1 is raised to a positive potential. Alternately, all of the odd numbered column lines CL1, CL3, etc. could be connected in common and have their voltages changed in unison in order to read out the ROS FET devices 111B, 112B and 113B to their respective bit lines BL1, BL2 and BL3 when the word line WL ROS1 is raised to a positive potential.

Alternately, if the word line WL ROS2 were raised to a positive potential, then ROS FET devices 121A, 122A and 123A would be read out to their respective corresponding bit lines BL1, BL2 and BL3 when the even numbered column lines CL0 and CL2 were reduced to ground potential. Alternately, while the word line WL ROS2 is at a positive potential, if the odd numbered column lines CL1 and CL3 were reduced to ground potential, then the ROS FET devices 121B, 122B and 123B would respectively be read out to the bit lines BL1, BL2 and BL3.

The reading and writing of the RAM FET device 112D and its associated capacitive charge storage device 112C in the cell 112 is described as follows, in conjunction with the timing diagram of FIG. 9. The RAM FET device 112D and its capacitor 112C operate as a single device, dynamic, random access memory, storage element in the manner described in U.S. Pat. No. 3,387,286 by Dennard, entitled "Field Effect Transistor Memory," assigned to the instant assignee. When a binary one is to be written into the RAM, a unit of charge is transferred from the bit line through the RAM FET device to its associated capacitor where it is stored until time to be read out. Since storage of the charge occurs between an N type doped substrate electrode, such as the region 142 in FIG. 6, and a superincumbent polycrystalline silicon capacitor electrode such as electrode 146 in FIG. 6, there is a certain amount of charge leakage which occurs from the capacitor. Thus, a periodic refresh cycle is provided for each RAM cell in order to maintain the stored charge at a significantly large magnitude to enable it to be successfully read. In order to read a RAM cell such as is disclosed by Dennard in the above-referenced patent, the gate of the RAM FET device is made positive so as to place the FET device in conduction, thereby allowing the transfer of the charge stored on the capacitor to the bit line where it is sensed by the sense amplifier connected to the bit line.

Referring now to cell 112 in FIG. 4 and the RAM FET device 112D and its associated capacitor 112C and further referring to the timing diagram of FIG. 9, the operation of the RAM component of the cell 112 will be discussed. In FIG. 9, during the write enable interval which extends from an initial time T1 to a concluding time T4, the RAM in cell 112 can be written into. In order to write into the RAM in cell 112, the bit line BL2 has its potential raised from an initial ground potential to a positive 5 volt potential at the time T2 and the duration of the raised potential extends to a succeeding time T3. Coincident with the rise in the bit line potential, the potential of the word line WL RAM1 is raised from an initial ground potential to a positive 5 volt potential at the time T2 and this continues until the subsequent time T3. Since the gate-to-source potential for the RAM FET device 112D is positive, the device is conductive between the times T2 and T3 and thus charge flows from the bit line BL2 to the plate 142 of the capacitor 112C, thereby raising the potential difference across the capacitor as is shown by the waveform for the capacitor voltage 112C between the times T2 and T3 in FIG. 9. After the time T3 when the word line WL RAM1 has its potential reduced back to ground potential, the RAM FET device 112D is no longer conductive and the charge stored on the capacitor 112C represents the storage of a binary "one" for example.

The information stored on the capacitor 112C is read as follows. The read enable interval extends from time T5 through time T9. At time T6, the word line WL RAM1 rises from its prior ground potential level to a +5 volt potential causing the gate-to-source potential of the RAM FET device 112D to be positive, placing it in a conductive state. The charge stored on the capacitor 112C then flows through the RAM FET device 112D to the bit line BL2 causing a positive going pulse to occur on the bit line between the time T6 and the time T8. This positive going voltage pulse on the bit line BL2 is sensed by the sense amplifier 200, thereby achieving a read-out of the binary information stored in the capacitor 112C.

During the writing operations and reading operations for the RAM FET device 112D, the ROS word line WL ROS1 is maintained at a ground potential in order to insure that no current is conducted through the ROS FET device 112A or the ROS FET device 112B to the bit line BL2, thereby confusing the read-out of the RAM FET device 112D. Still further, all other ROS and RAM word lines controlling the conduction of FET devices connected to the bit line BL2 are maintained at ground potential in order to insure that only the RAM FET device 112D is being read out to the bit line BL2.

The overall chip architecture for the second embodiment of the invention is shown in FIG. 10 wherein the array 204 of FIG. 5 is shown connected between pull-up circuits 206 and the sense amplifiers 200 which are respectively connected to opposite ends of the column lines and bit lines in the array. The array 204 is also shown in FIG. 10 connected between RAM word line decoders and drivers and their associated pull-down circuits 208 and ROS word line decoders and drivers and their associated pull-down circuits 210. Bit line decoders 212 will select the respective bit lines to be activated in order to selectively access various portions of the array 204. The off-chip drivers 214 will output the signals received from the sense amplifiers 200 to external utilization circuitry.

THIRD EMBODIMENT—A TWO BIT ROS/RAM CELL WITH AN ASYMMETRIC READ-OUT

Figure 11:
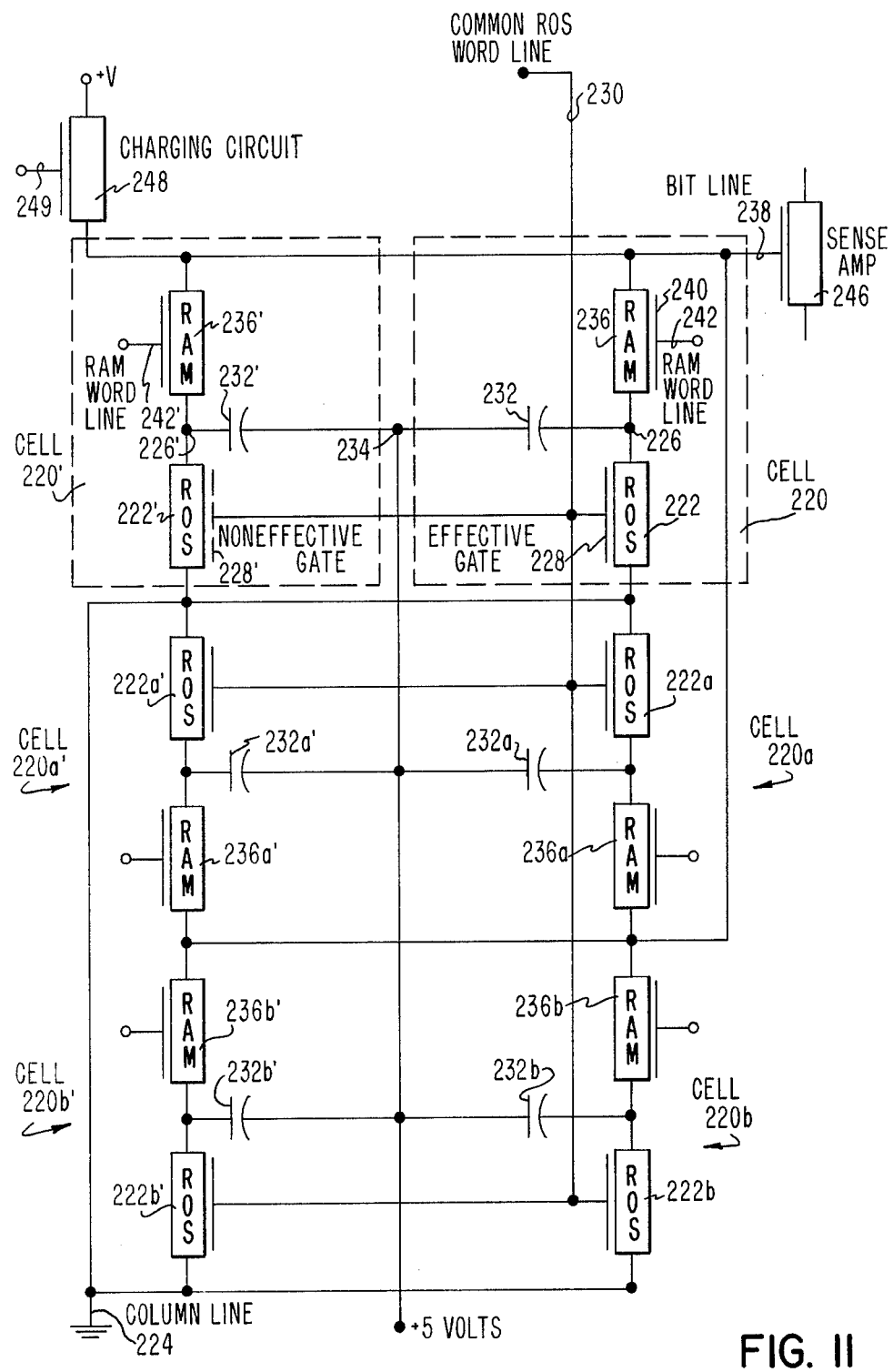
FIG. 11 is a circuit schematic diagram of the ROS/RAM cell for a third embodiment of the invention.

FIG. 11 shows a circuit schematic diagram of the third embodiment of the invention. A merged ROS/-RAM cell 220 includes a first FET device 222 which has its source/drain path connected between a column line 224 and a cell node 226 and has a selectively programmable gate 228 connected to a first word line 230, for providing read-only storage for a first binary bit by conducting current between the column line 224 and the cell node 226 in response to a signal on the first word line 230 when the selectively programmable gate 228 has a first binary state. The first FET device 222 will block current between the column line 224 and the cell node 226 when the selectively programmable gate 228 has a second binary state. The first binary state is achieved by providing an effective gate for the first FET device 222, such as by providing for a thin silicon dioxide layer as a gate insulator. The second binary state for the first FET device 222 is provided by providing a thick silicon dioxide layer as the gate insulator, thereby rendering the gate electrode non-effective.

The merged cell 220 further includes a charge storage element 232 which is connected between the cell node 226 and a constant potential node 234, for dynamically storing a charge representing a binary bit.

The merged cell 220 further includes a second FET device 236 which has its source/drain path connected between a bit sensing line 238 and the cell node 226 and which has a gate 240 connected to a second word line 242. The second FET device 236 provides a read/write random access memory for a second binary bit by conducting current between the bit sensing line 238 and the charge storage element 232 at the cell node 226 in response to a signal on the second word line 242.

The first FET device 222 is read by passing a charge from the bit sense line 238 through the second FET device 236 to the charge storage element 232 during a first stage. This is followed by selectively discharging the charge storage element 232 through the first FET device 222 to the column line 224 during a second stage if the selectively programmable gate 228 of the first FET device 222 has the first binary state where its electrode is effective. This is followed by then pulsing the second word line 242 so as to transmit any charge still stored on the charge storage element 232 through the second FET device 236 to the bit line 238 so as to sense whether the charge storage element 232 has been discharged through the first FET device 222. If no charge is detected during this third stage, then the gate 228 for the first FET device 222 is in its first binary state and is effective. Alternately, if charge is sensed to still be stored on the charge storage capacitor 232 when the second FET device 236 is pulsed during the third stage, then this indicates that the gate 228 for the first FET device 222 is in its second binary state and is not effective.

In this manner, the charge storage element 232 is shared for both read-only storage and read/write random access memory operations in the merged cell 220.

The circuit shown in FIG. 11 further includes a charging circuit 248 which is connected to the bit sense line 238 for charging the bit sense line in response to a control signal on line 249. A sense amplifier circuit 246 is connected to the bit sensing line 238, for sensing if the second FET device 236 has passed current from the cell node 226. The charging circuit 248 provides current through the second FET device 236 to the charge storage element 232 to write a one or a zero state therein. At a later stage of the sense amplifier 246 will then sense the one or zero state of the charge stored in the charge storage element 232 in response to a signal on the second word line 242. In this manner, the read/write random access memory operation takes place.

A plurality of merged cells can be incorporated in an integrated circuit memory array. A second merged cell 220' is shown in FIG. 11 having a first FET device 222' which corresponds to the first FET device 222 in the merged cell 220. The merged cell 220' has a charge storage element 232' which corresponds to the charge storage element 232 of the merged cell 220. The merged cell 220' has a second FET device 236' which corresponds to the second FET device 236 of the merged cell 220. The operation of the merged cell 220' is identical to the operation of the merged cell 220. FIG. 11 shows a total of six merged cells 220, 220', 220a, 220a', 220b, and 220b', each cell having a respective RAM FET device 236, 236', 236a, 236a', 236b or 236b'. Each cell has a respective ROS FET device 222, 222', 222a, 222a', 222b or 222b'. And each cell has a respective charge storage element 232, 232', 232a, 232a', 232b, or 232b'.

The interconnection of the plurality of merged cells 220, 220', etc. in the memory array shown in FIG. 11 is as follows. The first word line 230 is connected in common to the gates of all of the first FET devices 222, 222', etc. in all of the cells. The column line 224 is at a constant potential such as ground, and is connected in common to the source/drain path of the first FET devices 222, 222', etc. of all of the cells in the array. The bit line 238 is connected to the source/drain path of each of the second FET devices 236, 236', etc. of all of the cells in the array.

OPERATION OF THE THIRD EMBODIMENT

A particular cell in FIG. 11 is selected for ROS or RAM operation by pulsing its respective second word line 242, 242', etc. If the RAM operation is to be performed by a particularly selected cell, then the charging circuit 248 provides a charge to the bit line 238 and the selected merged cell 220 has its corresponding second word line 242 pulsed to turn on its corresponding second FET device 236, thereby allowing the bit line 238 to charge the capacitive storage device 232. Later, when the RAM device 236 is to be accessed, the corresponding second word line 242 is pulsed and its output is sensed by the sense amplifier 246.

The operation of a selected cell of FIG. 11 for ROS read operations is as follows. FIG. 12 shows the waveforms for a read operation on ROS device 222 which has an effective gate. FIG. 13 shows the waveforms for a read operation on ROS device 222' which does not have an effective gate. At time T1, the charging circuit 248 charges the common bit line 238 as shown in FIGS. 12 and 13.

The second word line 242 for the corresponding merged cell 220 is then pulsed from time T2 to time T3, thereby allowing the charge storage capacitor 232 to be charged through the corresponding second FET device 236. During a second stage, the first word line 230 which is common to all read-only storage FET devices in the array, is pulsed from time T4 to time T5, thereby rendering conductive all FET read-only storage devices 222, 222', etc. which have an effective gate 228.

In the particular example for the merged cell 220, the gate 228 is effective and therefore the charge stored on the capacitive charge storage device 232 will be discharged through the first FET device 222 between time T4 and T5, as shown in FIG. 12. Then, during a third stage, the second word line 242 is pulsed from time T6 to T7, thereby connecting the charge storage capacitor 232 through the second FET device 236 to the sense amplifier circuit 246 in order to determine whether a residual charge remains on the capacitive charge storage device 232. In the case of cell 220, since there is an effective gate 228 for the first FET device 222, no residual charge will be found on the charge storage element 232 and therefore a binary one value will be considered to have been permanently stored in the read-only storage FET device 222, as is shown in FIG. 12.

This can be contrasted with the operation of the merged cell 220', wherein the gate 228' for the first FET device 222' is not effective, and therefore if a read-only storage read operation were to take place for the cell 220', the third stage interrogation of the residual charge on the charge storage capacitor 232' between time T6 and T2 would indicate that charge still remained on the capacitor 232', as shown in FIG. 13. This would then indicate that a binary zero state had been permanently stored in the read-only storage FET device 222'.

Thus it is seen that the simplified circuit topology and mode of operation for the merged cell ROS/RAM of FIG. 11 provides a high packing density per unit function.

It can be appreciated that other techniques can be used to permanently program a binary one or a binary zero into the ROS devices. For example, instead of merely deleting the connection of the corresponding gate to the word line, the ROS device can be selectively programmed by selectively altering its gate threshold potential by means of ion implantation, or etching techniques on its gate electrode, for example. In addition, electrically programmable read-only memory devices (known as PROM, EEROM, or EAROM devices) can be substituted for the ROS devices described herein. Such devices are described, for example, in copending U.S. patent application Ser. No. 153,359, filed May 27, 1980 by H. N. Kotecha, entitled "Dual Gate EAROM Cell Using Graded Energy Band Gap Insulator" and are further described in copending U.S. patent application Ser. No. 160,530, filed June 18, 1980 by H. N. Kotecha, entitled "Dense PROM and EEROM Array Device," both applications being assigned to the instant assignee.

The above-described embodiments for a combined ROS and RAM storage cell, can be advantageously employed in a control storage for a microprocessor. The control storage of a microprocessor typically has a read-only memory portion for storing microinstructions of the most basic, repetitive type, and a read/write memory portion for storing higher level microinstructions. The compact embodiment of the combined ROS/RAM circuit disclosed above, will provide an advantageous embodiment for the control storage. Other advantageous applications can include writing engineering changes into the RAM portion of a read-only storage product.

Still other advantages are provided by the above-described combined ROS and RAM storage cell, such as the use of common peripheral circuits for both the ROS and RAM components. In addition, a symmetric cell topology results in a better packing density, when the cell is laid out in a large scale memory array.

Although specific embodiments of the invention have been disclosed, it will be understood by those of skill in the art that the foregoing and other changes in form and details may be made therein without departing from the spirit and the scope of the invention.

Having thus described our invention, what we claim is new, and desire to secure by Letters Patent is:

1. A combined read-only storage and read/write random access memory integrated circuit, comprising:
   a first FET device having its source/drain path connected between a column line and a bit sensing line and having a selectively programmable gate connected to a first word line, for providing read-only storage for one binary bit by conducting current between said bit sensing line and said column line in response to a signal on said first word line when said selectively programmable gate has a first binary state and by blocking current between said bit sensing line and said column line when said selectively programmable gate has a second binary state;
   a second FET device having its source/drain path connected between said bit sensing line and a charge storage element and having a gate connected to a second word line, for providing read/write random access memory for one binary bit by conducting current between said bit sensing line and said charge storage element in response to a signal on said second word line;
   whereby said bit sensing line is shared for both read-only storage and read/write random access memory operations.

2. The integrated circuit of claim 1, which further comprises:
   a charging circuit connected to said column line, for charging said column line;
   a sense amplifier circuit connected to said bit sensing line, for sensing if said first FET device has discharged said column line indicating said first binary state;
   a write driver circuit connected to said bit sensing line, for providing current through said second FET device to said charge storage element to write a one or zero state therein;
   said sense amplifier sensing said one or zero state of said charge storage element in response to said signal on said second word line.

3. The integrated circuit of claim 1, which further comprises:
   a charging circuit connected to said bit sensing line, for charging said bit sensing line;
   a sense amplifier circuit connected to said bit sensing line, for sensing if said first FET device has discharged said bit sensing line indicating said first binary state;
   a write driver circuit connected to said bit sensing line, for providing current through said second FET device to said charge storage element to write a one or zero state therein;
   said sense amplifier sensing said one or zero state of said charge storage element in response to said signal on said second word line.

4. The integrated circuit of claim 1, wherein said first FET device is programmable by selectively deleting its gate.

5. The integrated circuit of claim 1, wherein said first FET device is programmable by selectively altering its gate threshold potential.

6. A combined two bit read-only storage and one bit read/write random access memory integrated circuit cell, comprising:
   a first FET device in said cell having its source/drain path connected between a first column line and a bit sensing line and having a first selectively programmable gate connected to a first word line, for providing read-only storage for a first binary bit by conducting current between said bit sensing line and said first column line in response to a signal on said first word line when said first selectively programmable gate has a first binary state and by blocking current between said bit sensing line and said column line when said first selectively programmable gate has a second binary state;
   a second FET device having its source/drain path connected between a second column line and said bit sensing line and having a second selectively programmable gate connected to said first word line, for providing read-only storage for a second binary bit by conducting current between said bit sensing line and said second column line in response to a signal on said first word line when said second selectively programmable gate has a first binary state and by blocking current between said bit sensing line and said column line when said second selectively programmable gate has a second binary state;
   a third FET device in said cell having its source/drain path connected between said bit sensing line and a charge storage element and having a gate connected to a second word line, for providing read/write random access memory for a third binary bit by conducting current between said bit sensing line and said charge storage element in response to a signal on said second word line;
   whereby said bit sensing line is shared for both two bits of read-only storage and one bit of read/write random access memory.

7. The integrated circuit of claim 6, wherein said first FET device is programmable by selectively deleting its gate.

8. The integrated circuit of claim 6, wherein said first FET device is programmable by selectively altering its gate threshold potential.

9. A combined read-only storage and read/write random access memory integrated circuit cell, comprising:
   a first FET device having its source/drain path connected between a column line and a cell node and having a selectively programmable gate connected to a first word line, for providing read-only storage for a first binary bit by conducting current between said column line and said cell node in response to a signal on said first word line when said selectively programmable gate has a first binary state and by blocking current between said column line and said cell node when said selectively programmable gate has a second binary state;
   a charge storage element connected between said cell node and a constant potential node, for dynamically storing a charge representing a binary bit;

a second FET device having its source/drain path connected between a bit sensing line and said cell node and having a gate connected to a second word line, for providing read/write random access memory for a second binary bit by conducting current between said bit sensing line and said charge storage element at said cell node in response to a signal on said second word line;

said first FET device being read by passing a charge from said bit sense line through said second FET device to said charge storage element during a first stage, selectively discharging said storage element through said first FET device to said column line during a second stage if said selectively programmable gate of said first FET device has said first binary state, and then pulsing said first word line to sense whether said storage element is discharged;

whereby said charge storage element is shared for both read-only storage and read/write random access memory operations.

10. The integrated circuit of claim 9, which further comprises:
a charge circuit connected to said bit sense line, for charging said bit sense line;
a sense amplifier circuit connected to said bit sensing line, for sensing if said second FET device has passed current from said cell node;
said charging circuit providing current through said second FET device to said charge storage element to write a one or zero state therein;
said sense amplifier sensing said one or zero state of said charge storage element in response to said signal on said second word line.

11. The integrated circuit of claim 9, wherein said first FET device is programmable by selectively deleting its gate.

12. The integrated circuit of claim 9, wherein said first FET device is programmable by selectively altering its gate threshold potential.

13. A combined read-only storage and read/write random access memory integrated circuit, comprising:
a non-volatile storage device having a switchable conduction path connected between a column line and a bit sensing line and having a selectively programmable control input connected to a first word line, for providing read-only storage for one binary bit by conducting current between said bit sensing line and said column line in response to a signal on said first word line when said selectively programmable control input has a first binary state and by blocking current between said bit sensing line and said column line when said selectively programmable control input has a second binary state;
a volatile storage device having its path connected between said bit sensing line and a charge storage element and having a control input connected to a second word line, for providing read/write random access memory for one binary bit by conducting current between said bit sensing line and said charge storage element in response to a signal on said second word line;
whereby said bit sensing line is shared for both read-only storage and read/write random access memory operations.

14. The integrated circuit of claim 13, which further comprises:
a charging circuit connected to said column line, for charging said column line;
a sense amplifier circuit connected to said bit sensing line, for sensing if said non-volatile storage device has discharged said column line indicating said first binary state;
a write driver circuit connected to said bit sensing line, for providing current through said second FET device to said charge storage element to write a one or zero state therein;
said sense amplifier sensing said one or zero state of said charge storage element in response to said signal on said second word line.

15. The integrated circuit of claim 13, which further comprises:
a charging circuit connected to said bit sensing line, for charging said bit sensing line;
a sense amplifier circuit connected to said bit sensing line, for sensing if said non-volatile storage device has discharged said bit sensing line indicating said first binary state;
a write driver circuit connected to said bit sensing line, for providing current through said volatile storage device to said charge storage element to write a one or zero state therein;
said sense amplifier sensing said one or zero state of said charge storage element in response to said signal on said second word line.

16. The integrated circuit of claim 13, wherein said non-volatile storage device is programmable by selectively altering the conduction property of said switchable conduction path during the manufacture of the device.

17. The integrated circuit of claim 13, wherein said non-volatile storage first FET device is programmable by electrically altering the conduction property of said switchable conduction path.

18. A combined two bit read-only storage and one bit read/write random access memory integrated circuit cell, comprising:
a first non-volatile storage device in said cell having a switchable conduction path connected between a first column line and a bit sensing line and having a first selectively programmable control input connected to a first word line, for providing read-only storage for a first binary bit by conducting current between said bit sensing line and said first column line in response to a signal on said first word line when said first selectively programmable control input has a first binary state and by blocking current between said bit sensing line and said column line when said first selectively programmable control input has a second binary state;
a second non-volatile storage device having a switchable conduction path connected between a second column line and said bit sensing line and having a second selectively programmable control input connected to said first word line, for providing read-only storage for a second binary bit by conducting current between said bit sensing line and said second column line in response to a signal on said first word line when said second selectively programmable control input has a first binary state and by blocking current between said bit sensing line and said column line when said second selectively programmable control input has a second binary state;
a volatile storage device in said cell having its switchable conduction path connected between said bit sensing line and a charge storage element and having a control input connected to a second word line, for providing read/write random access memory for a third binary bit by conducting current between said bit sensing line and said charge storage element in response to a signal on said second word line;

whereby said bit sensing line is shared for both two bits of read-only storage and one bit of read/write random access memory.

19. The integrated circuit of claim 18, wherein said first and second non-volatile storage devices are each respectively programmable by selectively altering the conduction property of said respective switchable conduction path during the manufacture of the device.

20. The integrated circuit of claim 18, wherein said first and second non-volatile storage devices are each respectively programmable by electrically altering the conduction property of said respective switchable conduction path.

21. A combined read-only storage and read/write random access memory integrated circuit cell, comprising:
a non-volatile storage device having its switchable conduction path connected between a column line and a cell node and having a selectively programmable control input connected to a first word line, for providing read-only storage for a first binary bit by conducting current between said column line and said cell node in response to a signal on said first word line when said selectively programmable control input has a first binary state and by blocking current between said column line and said cell node when said selectively programmable control input has a second binary state;
a charge storage element connected between said cell node and a constant potential node, for dynamically storing a charge representing a binary bit;
a volatile storage device having its switchable conduction path connected between a bit sensing line and said cell node and having a control input connected to a second word line, for providing read/write random access memory for a second binary bit by conducting current between said bit sensing line and said charge storage element at said cell node in response to a signal on said second word line;
said non-volatile storage device being read by passing a charge from said bit sense line through said conduction path of said volatile storage second FET device to said charge storage element during a first stage, selectively discharging said storage element through said conduction path of said volatile storage device to said column line during a second stage if said selectively programmable control input of said non-volatile storage device has said first binary state, and then pulsing said first word line to sense whether said storage element is discharged;
whereby said charge storage element is shared for both read-only storage and read/write random access memory operations.

22. The integrated circuit of claim 21, which further comprises:
a charge circuit connected to said bit sense line, for charging said bit sense line;
a sense amplifier circuit connected to said bit sensing line, for sensing if said volatile storage device has passed current from said cell node;
said charging circuit providing current through said volatile storage device to said charge storage element to write a one or zero state therein;
said sense amplifier sensing said one or zero state of said charge storage element in response to said signal on said second word line.

23. The integrated circuit of claim 21, wherein said non-volatile storage device is programmable by selectively altering the conduction property of said switchable conduction path during the manufacture of the device.

24. The integrated circuit of claim 21, wherein said non-volatile storage device is programmable by electrically altering the conduction property of said switchable conduction path.

25. A merged two bit read-only storage and one bit read/write random access memory integrated circuit cell, formed in a semiconductor substrate of a first conductivity type, comprising:
a first hexagonal region of a second conductivity type in said substrate, having a unit dimension from its center to its vertex, having a first side adjacent to a second side, and having a third side parallel with and opposite to said first side, with said center thereof coincident with a first axis, for serving as a common FET drain electrically connected to a bit sensing line;
a second hexagonal region of said second conductivity type in said substrate, electrically connected to a first column line, having said unit dimension from its center to its vertex, with its center coincident with said first axis, having a first side proximate to and spaced by a channel length from said first side of said first hexagonal region, for serving as an FET source forming a first ROS FET channel region therebetween in said substrate having a selectable threshold voltage for a first ROS FET device;
a third hexagonal region of said second conductivity type in said substrate, electrically connected to a second column line, having said unit dimension from its center to its vertex, with its center coincident with a second axis angularly displaced from said first axis by substantially 60°, having a first side proximate to and spaced by substantially said channel length from said second side of said first hexagonal region, for serving as an FET source forming a second ROS FET channel region therebetween in said substrate having a selectable threshold voltage, for a second ROS FET device;
a ROS word line electrode juxtaposed with and vertically separated from said first and second ROS FET channel regions by respective gate insulator layers, forming a common FET gate electrode for said first and second ROS FET devices;
a fourth generally hexagonal region of said second conductivity type in said substrate, having approximately said unit dimension from its center to its vertex, with its center approximately coincident with said first axis, having an extension on a first side thereof with an edge proximate to and spaced by approximately said channel length from said third side of said first hexagonal region, for serving as a first capacitor electrode of a RAM charge storage capacitor and as an FET source forming a RAM FET channel region in said substrate with said first hexagonal region, for a RAM FET device;

a RAM word line electrode juxtaposed with and vertically separated from said RAM FET channel region by a gate insulator layer, forming an FET gate electrode for said RAM FET device;

a capacitor electrode layer disposed above and vertically separated from said fourth hexagonal region by a capacitor insulator layer, forming a second capacitor electrode for said RAM charge storage capacitor;

said first ROS FET device providing read-only storage for a first binary bit by conducting current between said bit sensing line and said first column line in response to a signal on said ROS word line when said first ROS FET channel region has a first threshold voltage and by blocking current between said bit sensing line and said first column line when said first ROS FET channel region has a second threshold voltage;

said second ROS FET device providing read-only storage for a second binary bit by conducting current between said bit sensing line and said second column line in response to a signal on said ROS word line when said second ROS FET channel region has a first threshold voltage and by blocking current between said bit sensing line and said second column line when said second ROS FET channel region has a second threshold voltage;

said RAM FET device providing read/write random access memory for a third binary bit by conducting current between said bit sensing line and said charge storage capacitor in response to a signal on said RAM word line;

whereby said bit sensing line is shared for both two bits of read-only storage and one bit of read/write random access memory.

* * * * *